United States Patent [19]

Bartelt

[11] Patent Number: 4,596,467
[45] Date of Patent: Jun. 24, 1986

[54] DISSIMILAR SUPERIMPOSED GRATING PRECISION ALIGNMENT AND GAP MEASUREMENT SYSTEMS

[75] Inventor: John L. Bartelt, Westlake Village, Calif.

[73] Assignee: Hughes Aircraft Company, Los Angeles, Calif.

[21] Appl. No.: 590,135

[22] Filed: Mar. 16, 1984

[51] Int. Cl.$^4$ .............................................. G01B 9/02
[52] U.S. Cl. ................................... 356/363; 356/356
[58] Field of Search ............... 356/354, 355, 356, 363, 356/400, 401

[56] References Cited

U.S. PATENT DOCUMENTS

| 4,200,395 | 4/1980 | Smith et al. |
| 4,251,160 | 2/1981 | Bouwhuis et al. |
| 4,265,542 | 5/1981 | Snow .................................. 356/356 |
| 4,340,305 | 7/1982 | Smith et al. ......................... 356/356 |
| 4,402,610 | 9/1983 | Lacombat ....................... 356/355 X |

FOREIGN PATENT DOCUMENTS 0010998 5/1980 European Pat. Off.

OTHER PUBLICATIONS

Applied Physics Letter Oct. 1977, Flanders et al.
IBM Technical Disclosure Bulletin Dec. 1980, vol. 23, No. 7A.

Primary Examiner—F. L. Evans
Assistant Examiner—Matthew W. Koren
Attorney, Agent, or Firm—John A. Sarjeant; A. W. Karambelas

[57] ABSTRACT

A substrate having a diffraction grating of a first periodicity formed thereon, a mask having a diffraction grating of a second periodicity formed thereon, the mask and substrate being positioned such that the respective mask and substrate gratings are generally parallel opposing one another on the mask and substrate, means for providing collimated coherent light directed so as to impinge on the mask and substrate gratings, and means for separately collecting, recombining, and detecting the intensity of at least a first given order of diffracted light beams as respectively diffracted by the mask and substrate gratings.

10 Claims, 5 Drawing Figures

Fig. 1a.
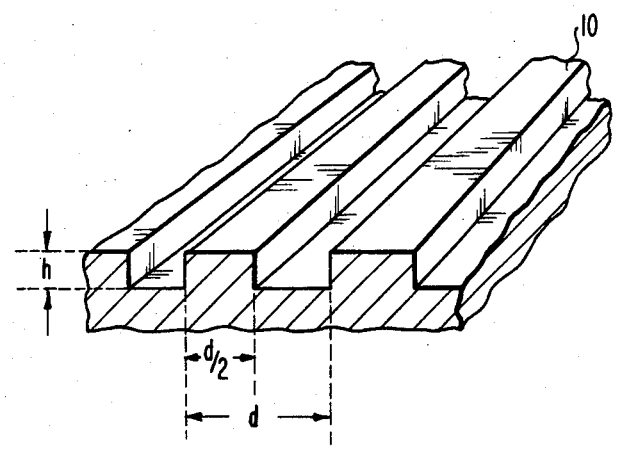
Fig. 1b.
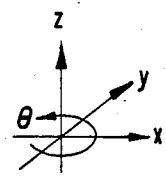
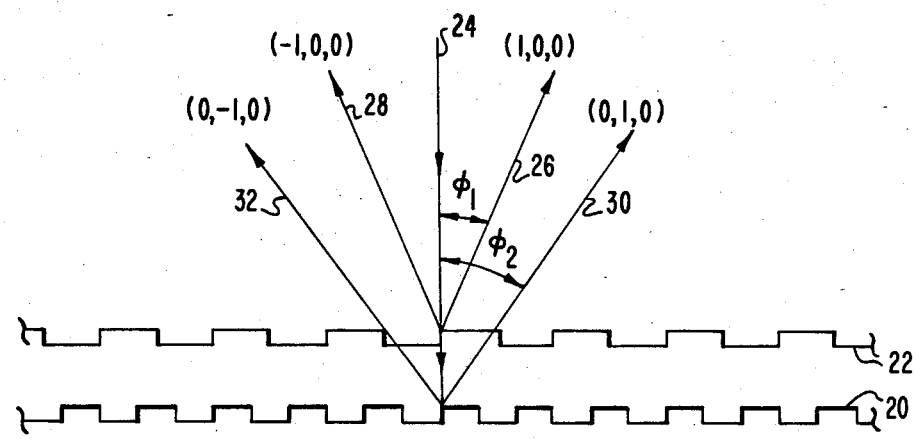
Fig. 2.

DISSIMILAR SUPERIMPOSED GRATING PRECISION ALIGNMENT AND GAP MEASUREMENT SYSTEMS

The Government has rights in this invention pursuant to Contract No. N66001-82-C-0124 awarded by the Department of the Navy.

BACKGROUND OF THE INVENTION

1. Field of the Invention

The present invention relates generally to a precision overlay alignment system and, particularly, to proximity and projection lithography systems wherein ions, electrons or photons are utilized to transfer a high resolution pattern from a mask to a substrate.

2. Description of the Prior Art

There is a continuing desire to further reduce the minimum feature size of integrated circuits. This imposes a requirement of repeatably obtaining an exceedingly accurate degree of alignment between a mask and a substrate for each sequential lithographic step in the fabrication of an integrated circuit. For obtaining integrated circuits having feature sizes of below 1.0 μm, an interferomic technique appears to possess the greatest likelihood of successful implementation.

D. C. Flanders et al., *A New Interferometric Alignment Technique*, Applied Physics Letters, Vol. 31, No. 7, Oct. 1, 1977, , pp. 426-428, describes the basic interferomic technique. Diffraction gratings of identical period are provided on the facing surfaces of a mask and substrate. The gratings are generally oriented with respect to one another such that they are parallel. A beam of laser light is directed normal to the diffraction grating planes with the result that diffracted light is returned at discrete angles from the incident laser beam, as may be determined by the equation:

$$n\lambda = d(\sin\phi_n - \sin\phi_i),$$

wherein n is the diffraction group number, $\lambda$ is the incident beam wavelength, d is the grating period and $\phi_n$ and $\phi_i$ are the angles that the diffracted and incident beams make with respect to the normal of the diffraction grating planes. Only those beams suffering the smallest unit of an angular diffraction, those that have suffered a net first order diffraction, are utilized in the Flanders et al. technique. Further, the Flanders et al. technique utilizes the fact that the diffracted beams occur to either side of the incident laser beam. Thus, the first order diffraction group includes both plus (n=+1) and minus (n=-1) order beams. The plus first order diffraction group is composed of those beams that only suffer a plus first order diffraction from the mask grating (indicated as (1,0,0) in summary notation), or a sequential combination of diffractions such as a zeroth order diffraction from the mask grating, a plus first order diffraction from the substrate grating, and a zeroth order diffraction returning through the mask grating (0,1,0). The plus first order diffraction group may also include such beams that have sequentially suffered a zeroth order diffraction through the mask grating, a minus first order diffraction from the substrate grating, and a plus second order diffraction through the mask grating (0,-1,2). The result is an effective or net plus first order diffraction. Due to the symmetry of the gratings, a generally symmetrical set of beams are diffracted by the mask and wafer gratings so as to form both plus and minus first order diffraction groups.

The Flanders et al. technique measures the relative difference in the plus and minus first order diffraction group intensities to obtain an indication of the alignment of the mask and substrate gratings. For an in-plane displacement of the mask with respect to the substrate less than the period of the gratings, there is a corresponding variation in the relative intensities of the plus and minus first order diffraction groups due to the mutual interference between beams within each group. Ideally, there is a zero intensity difference between the plus and minus first order diffraction groups only when the mask and substrate diffraction grating lines are aligned. With the detection of sufficiently small intensity differences Flanders et al. concludes that alignment errors as small as 200 Å can be detected.

There are, however, a number of inherent problems with the Flanders et al. technique. Of principal significance is that the Flanders et al. technique is highly sensitive to the specific spacing between the mask and substrate. In practical applications, this gap distance may vary due to bowing of the mask or wafer, or both, the tolerance errors in the machinery positioning the mask and substrate (particularly in such systems where there is a substrate step and repeat exposure sequence), and such transient perturbations as due to thermal, acoustic, and mechanical vibrations. These sources of gap distance variations further compound the simple fact that a gap exists at all. This interferomic technique relies on the interference between the respective first order diffracted group beams diffracted from the mask grating with those from the substrate grating. Since there is a spacing between the mask and substrate gratings, there is an inherent difference in the path length traversed by the respective mask and substrate grating diffracted beams. This introduces an effective phase retardation in those beams diffracted by the substrate grating. Thus, the interference that naturally occurs between the mask and substrate diffracted beams produces an equal intensity change but of opposite effective polarity in the respective plus and minus group beams. Consequently, when the mask and substrate gratings are in fact aligned, there will be an inherent difference in the intensities of the plus and minus first order diffraction group beams due to the presence of the gap.

While a constant difference in intensity might be appropriately dealt with, assuming the gap distance can be accurately and independently quantitized, the various causes of variations in the mask to substrate spacing are essentially random transients not subject to practical quantitization. Further, the variations in spacing are typically an appreciable fraction of the otherwise nominal gap distance. Consequently, there is no practical way to discriminate between mask and substrate grating alignment errors and the undesirable but nonetheless present variations in the mask to substrate spacing.

Another practical problem with the Flanders et al. technique is that it requires the diffraction efficiency of both the mask and substrate gratings to remain essentially constant and equal throughout the processing of the substrate. The efficiency of the mask grating may change due to the simple fact that different masks are utilized for the different sequential lithographic processing steps. However, the variations in mask grating efficiency alone are tolerable. In contrast, the efffective diffraction efficiency of the substrate grating is reduced by the simple fact that the substrate grating diffracted beams must pass twice through the mask grating. Further the substrate grating is utilized throughout the processing of the substrate and, therefore, is effectively exposed to the effects of all of the processing steps. Thus, the substrate grating efficiency degrades as the processing proceeds. Degradation of substrate grating efficiency results in a loss of its diffracted beam intensity and, thereby reduces the interference modulation of the plus and minus group beams. Consequently, for a given detector sensitivity, loss of grating efficiency directly increases the minimum limit of alignment error that can be detected.

SUMMARY OF THE INVENTION

The general purpose of the present invention is to provide a highly accurate lithography alignment system of practical utility.

This is accomplished by the present invention by providing a mask and substrate alignment system comprising a substrate having a diffraction grating of a first periodicity formed thereon, a mask having a diffraction grating of a second periodicity formed thereon, the mask and substrate being positioned such that the respective mask and substrate gratings are generally parallel opposing one another on the mask and substrate, means for providing collimated coherent light directed so as to impinge on the mask and substrate gratings, and means for separately collecting, recombining, and detecting the intensity of at least a first given order of diffracted light beams as respectively diffracted by the mask and substrate gratings. An indication of alignment between the mask and substrate gratings is obtained by comparing the relative intensity of the beams effectively diffracted only by the mask with those only effectively diffracted by the substrate with regard to their respective maximum obtainable intensities for their given diffracted beam orders.

Thus, the present invention retains the elemental simplicity of design and the capability for precision alignment present in the basic interferomeric technique.

Another advantage of the present invention is that it is insensitive to the presence of a gap between the mask and substrate grating in positioning the substrate with respect to the mask and, further, any transient variations in the gap distance within reasonable limits.

A further advantage of the present invention is that it is substantially insensitive to an initial difference and subsequent variations in the diffraction efficiency of the mask and substrate gratings.

Yet another advantage of the present invention is that it permits the direct measurement of the gap spacing between the mask and substrate during the positioning and subsequent maintenance of the substrate with respect to the mask.

A still further advantage of the present invention is that it is adaptable to a wide variety of proximity and projection lithography systems.

BRIEF DESCRIPTION OF THE DRAWINGS

These and other attendant advantages of the present invention will become apparent and readily appreciated as the same becomes better understood by reference to the following detailed description when considered in connection with the accompanying drawings, in which like reference numerals designate like parts throughout the figures and wherein:

FIG. 1a is a perspective view of a portion of a diffraction grating as used in the present invention;

FIG. 1b shows the coordinate system to be used in describing the orientation of the diffraction gratings utilized in the present invention;

FIG. 2 is a schematic representation of the dissimilar superimposed diffraction gratings and the diffraction of light therefrom;

DETAILED DESCRIPTION OF THE INVENTION

Figure 3:
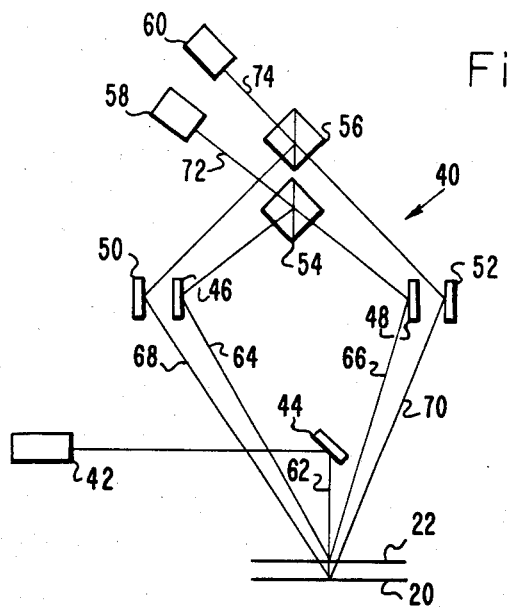
FIG. 3 is a diagrammatic view of a first embodiment of an apparatus employing the present invention.

The present invention was developed for use in a proximity type high resolution masked ion beam lithography (MIBL) system. Typically, such a system includes a collimated ion beam source, a relatively immobile ion-channeling replication mask, and an x-y translation stage including a mount for holding a substrate. In accordance with the present invention, the substrate is preprocessed to form gratings thereon substantially as represented in FIG. 1a. The gratings can be formed, using ordinary photolithographic techniques as a simple resist pattern on the surface of the substrate or etched directly into either the surface of the substrate or a layer formed thereon. Preferably, the diffraction grating is etched permanently into the substrate so as to provide a pattern having a constant period d of approximately 2 $\mu$m and a line width of d/2. The height h of the diffraction grating lines is generally selected to optimize its reflective diffraction efficiency with respect to a given diffraction order, preferably the first, and, as such, is selected depending on the wavelength of the incident alignment light beam, the index of refraction of the substrate and any layers thereon. Preferably, the source of incident alignment light is a low power laser producing a well collimated beam of coherent light. While a variety of lasers may be used, such as HeNe and Ar+, to provide an alignment light beam at any one of a wide range of frequencies, a HeNe laser emitting light having a wavelength of approximately 632.8 nanometer is preferred. For a diffraction grating etched into a silicon substrate, and generally meeting the above criteria, this incident beam wavelength corresponds to a diffraction grating line height h of approximately 3000 Å.

The mask grating is formed as a relief pattern provided as part of the ion-channeling mask. Dissimilar grating periods are chosen for the mask and substrate gratings in accordance with the present invention. The period of the mask grating is preferably chosen to be larger than that of the substrate to obtain the greater transmission efficiency inherent with relatively larger grating periods and, thereby, optimize the amount of zeroth order diffraction light passing through the mask grating. The basis for the selection of the two dissimilar grating periods will become apparent from the discussion below. Preferably, the mask grating period d is chosen as approximately equal to 3 $\mu$m with a line width of d/2 or 1.5 $\mu$m. The height h and, in particular, the cross sectional shape of the mask grating lines are selected to balance the diffraction efficiency between the zeroth order transmission of the incident beam and the reflective diffraction of first order diffraction beams.

The mask and substrate are overlaid in close proximity to one another so as to superimpose the dissimilar gratings of the mask and substrate. Preferably, pairs of gratings are provided along each edge of the mask and oriented within the plane of the mask at 90° with respect to one another. Substrate gratings are correspondingly located and oriented. This allows orientation of the mask and substrate in both the x and y direction of the coordinate system indicated in FIG. 1b. As will be explained below, this further allows for the proper rotational or theta alignment of the mask and substrate. As will also be explained in greater detail below, alignment of the mask and substrate in the z direction is essentially noncritical for x-y alignment. The present invention, however, provides for precision z distance measurement and alignment that is substantially insensitive to the x-y relative location of the gratings.

Referring now to FIG. 2, a schematic representation of the diffraction of an incident beam of light 24 from dissimilar superimposed gratings 20, 22 is shown. The direction of the beams generated by the diffraction of the incident beam 24 is given by:

$$n\lambda = d(\sin\phi_n - \sin\phi_i), \quad (1)$$

wherein n is the diffraction group number, $\lambda$ is the incident beam 24 wavelength, d is the grating period and $\phi_n$ and $\phi_i$ are the angles that the diffracted and incident beams make with respect to the normal of the diffraction grating planes. Considering for purposes of the present invention only the first order diffraction group and selecting $\phi_i = 0$, the diffracted beam angles $\phi_1$, $\phi_2$ from the plane of the incident beam 24 normal to the mask and substrate gratings and parallel to the length of the diffraction grating lines is given by:

$$\phi_n = \sin^{-1}(\lambda/d). \quad (2)$$

The use of dissimilar superimposed diffraction gratings thus results in the spatial separation of the respective plus and minus first order diffraction beams as respectively diffracted from the substrate grating 20 and the mask grating 22. For the preferred incident beam 24 wavelength and the preferred grating periods as noted above, $\phi_1$ is equal to approximately 12.18° and $\phi_2$ equals approximately 18.44°. The selection of the particular grating periods is based on the practical considerations of providing sufficient spatial separation between the respective plus and minus first order diffracted beams 26, 30, and 28, 32 so as to permit their subsequent manipulation in accordance with the present invention. The selection of the grating periods is also based on the practical consideration that the capture range of the alignment technique of the present invention is approximately one-half of the smaller of the two grating periods. The relative phase of the plus and minus order diffracted beams directed at diffraction angles given by Equation 2 for a given order will vary as the position of the corresponding diffraction grating is shifted laterally. The plus and minus order beams are coherently recombined with the result that the position information is converted to an intensity variable by mutual coherent interference. The magnitude of the beam intensity and the position of a grating can be related by deriving the time averaged Poynting vector magnitude for the recombined diffracted beams. In the context of the present invention for the mask grating alone (or, in the presence of the substrate grating, where the reflected zeroth order substrate grating reflectively diffracted beam is otherwise blocked) or the substrate grating either in the presence or absence of the mask grating, the time average Poynting vector magnitude is:

$$|\overline{S}| \approx \cos^2\left(\frac{2\pi\epsilon}{d}\right) \quad (3)$$

where $\epsilon$ is the lateral displacement and d is the grating period of the corresponding displaced grating. The cosine squared function evaluates to two complete cycles of intensity as $\epsilon$ goes from zero to d. Consequently, a nonambiguous alignment position can only be obtained if the superimposed dissimilar gratings are initially aligned with respect to one another within one-half of the period of the smaller of the two gratings.

In order to increase the capture range, larger grating periods can be utilized. In the case of grating periods of 10 and 11 $\mu$m for the substrate and mask gratings, respectively, a capture range of approximately 5 $\mu$m can be obtained. However, the spatial separation of the first order diffracted beams as diffracted from the mask and the substrate gratings, respectively, are substantially reduced. The first order diffraction angle for a diffraction grating of 10 $\mu$m is approximately 3.63° and, for a grating of a period of 11 $\mu$m, the diffraction angle is approximately 3.29°, based on an incident beam wavelength of 632.8 nanometers.

Another consideration in choosing the periods of the dissimilar diffraction gratings is that the larger diffraction grating periods inherently are associated with a lower diffraction efficiency. This results in a significant reduction of the available diffracted beam intensity. Preferably, for a grating pair, the smaller grating period is $np$ and the larger is $np+1$, where n is an integer and p is a unit length on the order of a micrometer.

In view of the foregoing, an optimal solution to the choice of dissimilar diffraction grating periods is to simply provide multiple pairs of superimposed dissimilar gratings of, preferably, 2 and 3 $\mu$m periods and 10 and 11 $\mu$m periods, respectively. This allows the larger capture range of the larger grating period pair to be utilized to place the mask and substrate in sufficient alignment to be within the capture range of the greater available precision of the smaller grating period pair. Thus, the advantages of using both the large and small dissimilar grating periods are obtained.

It is important to recognize from Equation 3 that the intensity magnitude of a recombined beam is dependent only on the lateral position of a single corresponding grating and not at all dependent on the gap distance between the mask and substrate gratings. Thus, for those cases noted above in which Equation 3 applies, the determination of alignment is independent of the presence of a mask to substrate gap or any variation therein.

In the sole case where zeroth order mask transmitted beam is returned back through the mask as a zeroth order substrate grating diffracted beam, there will be a detectable variation in the intensity of the mask diffracted and subsequently recombined beam as measured at the mask position detector. The zeroth order transmitted beam may be returned by a reflective zeroth order diffraction from the substrate grating or, in the absence of any substrate grating, simply reflected by a specular area of the substrate. This reflected zeroth order beam will be diffracted, at least in part, by the mask grating, thereby, producing plus and minus first order diffracted beams $(0,0,\pm 1)$. These beams will mutually interfere with the corresponding singly diffracted first order beams (±1,0,0) diffracted by the mask. Consequently, the recombined mask first order diffracted beam intensity will have a Poynting vector magnitude given by:

$$|\overline{S}| \approx 2(1 + 2\cos 2\phi), \quad (4)$$

where $$\phi = g\left(\frac{2\pi}{\lambda}\right)\left[1 - \sqrt{1 - \left(\frac{\lambda}{d}\right)^2}\right], \quad (5)$$

and where g is the gap spacing, λ is the wavelength of the incident beam, and d is the period of the mask diffraction grating. Thus, assuming the position of the mask grating is first established, the present invention permits the accurate measurement of the mask to substrate gap spacing g based on the measured intensity of the recombined mask diffracted beam. Of particular advantage is that the gap measurement is essentially independent of the specific lateral position of the substrate grating.

Referring now to FIG. 3, a complete optical system embodying the present invention is shown schematically. The alignment apparatus 40 includes a laser source 42 and an incident beam mirror 44 arranged to direct an incident beam 62 toward the substrate and mask gratings 20, 22. The substrate and mask gratings 20, 22, shown not to scale, diffract the first order diffracted beams toward corresponding collection mirrors 46, 48, 50, 52. The respective collection mirror pairs 46, 48 and 50, 52 collect the respective plus and minus first order diffracted beam pairs 64, 66 and 68, 70 and redirect them to the beam splitters/recombiners 54, 56, respectively. The separate first order diffracted beams are recombined by mutual coherent interference at their respective beam splitters 54, 56 and pass on to the detectors 58, 60. These detectors are preferably semiconductor opto-detectors selected as being sensitive to optical radiation of the same wavelength as the light emitted by the laser light source 42. Since the grating periods of the substrate and mask gratings 20, 22 are dissimilar and by the unique placement of the collection mirrors 46, 48, 50, 52, only the first order diffracted beams that have further suffered only a single non-zero order diffraction are collected. All higher order diffracted beams as well as all first order diffraction group beams that have been multiply diffracted will emerge from the substrate and mask gratings at sufficiently different spatially distributed diffraction angles to permit the selection of only the first order singly diffracted beams 64(−1,0,0), 66(1,0,0) and 68(0,−1,0), 70(0,1,0). The placement of the collection mirrors 46, 48, 50, 52 and the beam splitters 54, 56, is further selected such that there is a common path length for both the plus and minus first order singly diffracted beams that are respectively diffracted from the mask and substrate gratings 20, 22. Naturally, the coherence length of the laser light source 42 must be greater than the optical path length from the laser 42 to either detector 58, 60.

Figure 4:
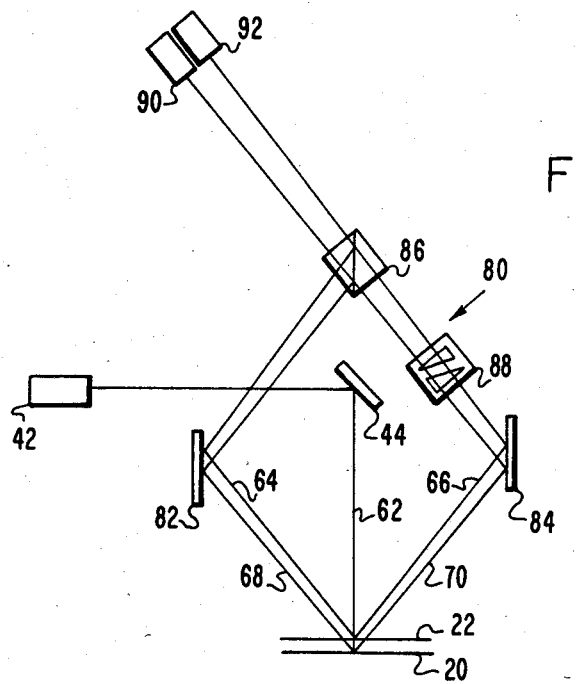
FIG. 4 is a diagrammatic view of an optimized optical path embodiment of an apparatus employing the present invention.

An alternate embodiment of the present invention is shown in FIG. 4. The alignment system 80 again includes the laser source 42 and incident beam mirror 44 for directing an incident laser beam 62 so as to impinge on the dissimilar superimposed substrate and mask gratings 20, 22. A single pair of collection mirrors 82, 84 are positioned to collect the respective minus and plus first order singly diffracted beams 64(−1,0,0), 68(0,−1,0) and 66(1,0,0), 70(0,1,0) and redirect them along separate optical paths to a common beam splitter/recombiner 86. The respective first order singly diffracted beams are effectively recombined by mutual coherent interference at the beam splitter 86 and directed to respective detectors 90, 92. Similar to the previous alignment system 40, the collection mirrors 82, 84 are positioned so as to collect only the first order singly diffracted light from the mask and wafer gratings 22, 20. Path length compensation is accomplished by the provision of a standard Soleil-Babinet compensator placed in the path of the plus first order singly diffracted beams 66, 70 from the mask and substrate gratings 22, 20. Thus, path length compensation is obtained relatively independent of the placement of the collection mirrors 82, 84. Consequently, the placement of the collection mirrors 82, 84 may be optimized so as to collect only the first order singly diffracted group 64, 66, 68, 70.

In a practical application, a number of alignment systems 40 or 80 are utilized as subsystems within a lithography system, such as MIBL. Each alignment subsystem is utilized to derive x or y alignment information from a corresponding superimposed dissimilar diffraction grating pair. Preferably, at least four such subsystems are utilized with four corresponding dissimilar superimposed grating pairs spaced equally about the periphery of a typically square area, the diagonally disposed grating pairs sharing a common grating line orientation that is rotated in-plane 90° from that of the other two grating pairs.

In operation, an initial alignment between a mask and a substrate is obtained by first moving the mask in a given x direction and observing the intensity phase change at the corresponding detectors. At this point, the return of any zeroth order mask grating transmitted beam must be prevented as may be accomplished by simply not providing the substrate in the vicinity of the mask. The mask grating can be moved by physically translating the position of the mask. Preferably, however, the effective position of the mask can be modified by adjusting the relative path length of the plus and minus first order singly diffracted beams. This may be accomplished through the use of the compensator 88 of FIG. 4. Positioning the compensator 88 so as to modify the corresponding plus first order singly diffracted beams 66, 70 from the mask and substrate, respectively, prevents the introduction of a relative path lenth difference error thereinbetween. Thus, as the mask grating is laterally displaced, effectively or otherwise, the recombined mask beam detector 92 will observe a sinusoidal variation in the intensity of the recombined first order singly diffracted beam incident thereon. Any phase point along the sinusoidal variation in intensity can be selected as a null position point. If necessary, the mask may be rotated as well as shifted, effectively or otherwise, so that a common null point is observed by the detector of both of the x direction subsystems. A y direction mask null point is similarly selected. The substrate is then moved into the vicinity of the mask so as to superimpose the gratings within the appropriate capture range. Null x and y positions for the substrate x and y direction gratings are then selected similarly. Although the present invention permits the x and y phase point nulls of the mask to be selected independently of one another as well as either of the x and y phase point nulls of the substrate, preferably all of the phase point nulls are selected to be 90° past the maximum intensity obtainable at their respective detectors when moved within their capture ranges in a given x or y direction. Subsequent alignments between the mask and substrate are accomplished by placing the mask and substrate in sufficiently close alignment, in both the x and y directions, so as to again be within the capture ranges of the various dissimilar superimposed diffraction gratings. The substrate is then again translated in the x and y directions until the intensities measured at the various detectors correspond substantially to the intensity phase point nulls selected during the initial alignment.

Consistent with the foregoing, during the positioning for and subsequent maintenance of the aligned position of the substrate, the mask to substrate gap spacing can be measured and continually monitored by observing the intensity of the mask signal at the recombined mask beam detector 92 in view of Equations 4 and 5. Naturally, the position of the substrate can be modified as necessary to obtain the desired gap spacing and plane parallelism between the mask and substrate.

The present invention thus provides a method of obtaining interferomic precision alignment between dissimilar period superimposed diffraction gratings that can be implemented in a simple and highly reliable optical system. As such, the present invention permits the precision alignment of the dissimilar superimposed diffraction gratings to be obtained and maintained substantially independent of variations in the spacing between the relative diffraction efficiency of the dissimilar period gratings. Further, the present invention permits the interferomic precision measurement of and, thereby, control of the mask to substrate gap spacing.

It should be understood, of course, that the foregoing is a description of the preferred embodiments of the present invention and that many modifications and variations are possible in light of the above teachings. These modifications and variations include, but are not limited to, utilizing laser light sources of different selected wavelengths, folding the optical path of the alignment system so as to obtain nonsymmetrical diffraction from the mask and substrate gratings, positioning the optics to collect, recombine, and detect diffraction order beams of one given order to obtain a mask position signal and of another given order to obtain a substrate position signal, utilizing different materials to form the mask, pairing mask gratings with plane substrate surfaces to obtain gap measurement sites alone or separate from dissimilar grating alignment sites, and utilizing the present invention in other proximity and projection pattern replicating lithography systems. It is therefore to be understood that, within the scope of the appended claims, the invention may be practiced otherwise than is specifically described above.

What is claimed is:

1. A proximity interferometric alignment system comprising:
    (a) a substrate having a diffraction grating of a first periodicity formed thereon;
    (b) a mask having a diffraction grating of a second periodicity different from said first periodicity formed thereon, said mask and substrate being provided in close proximity to one another so as to substantially superimpose said mask and substrate gratings;
    (c) means for providing a collimated coherent lightbeam directed so as to impinge on said mask and substrate gratings; and
    (d) means for separately collecting, recombining, and detecting the intensity of a first given order of singly diffracted lightbeams as diffracted by said mask grating and of a second given order of singly diffracted lightbeams as diffracted by said substrate grating.

2. The interferometric alignment system of claim 1 further comprising:
    (a) means for adjusting the in-plane position of said mask with respect to said collecting, recombining and detecting means; and
    (b) means for adjusting the in-plane position of said substrate with respect to said collecting, recombining and detecting means.

3. The interferometric alignment system of claim 2 further characterized in that said mask and substrate gratings are provided on respective facing surfaces of said mask and said substrate.

4. The interferometric alignment system of claim 1 further characterized in that the periods of said masks and substrate gratings are between approximately one and fifteen microns.

5. The interferometric alignment system of claim 4 further characterized in that the periods of said mask and substrate gratings differ by approximately one micron.

6. The interferometric alignment system of claim 1 further characterized in that said first given order and said second given order of diffracted light both correspond to first order singly diffracted light from said mask and said substrate gratings, respectively.

7. An interferometric alignment system for the precision alignment of a first element with a second element comprising:
    (a) a first diffraction grating of a first periodicity associated with said first element;
    (b) a second diffraction, grating of a second periodicity different from said first periodicity associated with said second element;
    (c) means for positioning said first and second elements such that said first and second grating are superimposed with respect to one another;
    (d) means for providing collimated coherent light directed so as to impinge on said first and second gratings;
    (e) collection optics for selecting and redirecting the plus and minus diffraction beam pairs of a first given diffraction order from said first grating and a second given diffraction order from said second grating;
    (f) recombination optics for receiving the redirected beam pairs from said collection optics and recombining the respective beam pairs by mutual coherent interference to obtain a first element recombined beam and a second element recombined beam, respectively; and
    (g) first and second detection means for separately detecting the intensity of said first and second element recombined beams, respectively.

8. The system of claim 7 wherein said first and second diffraction gratings are provided in close proximity to one another as appropriate for use in a proximity lithography system.

9. The system of claim 7 further comprising projection optics interposed between said first and second elements so as to permit the demagnified projection of a pattern from said first element to be imaged on said second element as appropriate in a projection lithography system.

10. An interferometric gap measurement system for the precision measurement of the distance between a first element and a second element comprising:
   (a) a diffraction grating of a given periodicity associated with said first element;
   (b) a reflective surface area associated with said second element;
   (c) means for positioning said first and second elements such that said grating is superimposed over and is substantially plane parallel with said reflective surface area;
   (d) means for providing collimated coherent light directed so as to impinge on said grating and therethrough onto said reflective surface area;
   (e) collection optics for selecting and redirecting the plus and minus diffraction beams of a given diffraction order from said grating;
   (f) recombination optics for receiving the redirected beams from said collection optics and recombining the beams by mutual coherent interference to obtain a recombined beam; and
   (g) a detector positioned such that the recombined beam is incident thereon so as to detect the intensity thereof.

* * * * *